US007399497B2

(12) United States Patent
Imamura

(10) Patent No.: US 7,399,497 B2
(45) Date of Patent: Jul. 15, 2008

(54) METHOD FOR FORMING FILM, METHOD OF MANUFACTURING ELECTRONIC DEVICE, FILM FORMING SYSTEM, ELECTRONIC DEVICE, AND ELECTRONIC APPARATUS

(75) Inventor: Yoichi Imamura, Chino (JP)

(73) Assignee: Seiko Epson Corporation, Tokyo (JP)

( * ) Notice: Subject to any disclaimer, the term of this patent is extended or adjusted under 35 U.S.C. 154(b) by 816 days.

(21) Appl. No.: 10/821,964

(22) Filed: Apr. 12, 2004

(65) Prior Publication Data

US 2004/0256973 A1 Dec. 23, 2004

(30) Foreign Application Priority Data

Apr. 15, 2003 (JP) ............................ 2003-110364
Jan. 20, 2004 (JP) ............................ 2004-011895

(51) Int. Cl.
*B05D 5/06* (2006.01)
*B05D 1/00* (2006.01)
*C23C 16/00* (2006.01)

(52) U.S. Cl. ......................... 427/69; 427/466; 427/483; 427/70; 427/256; 427/561; 427/248.1

(58) Field of Classification Search ............. 427/64-70, 427/458, 475, 483, 562, 585, 599, 256
See application file for complete search history.

(56) References Cited

U.S. PATENT DOCUMENTS

| | | | | |
|---|---|---|---|---|
| 5,066,512 | A * | 11/1991 | Goldowsky et al. | 427/466 |
| 6,639,212 | B1 * | 10/2003 | Guevremont et al. | 250/282 |
| 6,696,105 | B2 * | 2/2004 | Hiroki et al. | 427/466 |
| 2003/0157269 | A1 * | 8/2003 | Ratner et al. | 427/535 |

FOREIGN PATENT DOCUMENTS

| | | |
|---|---|---|
| CN | 1123341 A | 5/1996 |
| JP | A-02-050957 | 2/1990 |
| JP | A-09-241833 | 9/1997 |
| JP | A 11-126691 | 5/1999 |
| JP | B2 3036436 | 2/2000 |
| JP | A-2000-355757 | 12/2000 |
| JP | 2001-353454 | 12/2001 |
| JP | A-2004-160388 | 6/2004 |
| JP | 2001353454 | * 12/2007 |
| WO | A1 WO 98/12689 | 3/1998 |

* cited by examiner

*Primary Examiner*—Timothy Meeks
*Assistant Examiner*—David Turocy
(74) *Attorney, Agent, or Firm*—Oliff & Berridge, PLC

(57) ABSTRACT

To provide a film forming method and a film forming system, which efficiently use materials and forming a high-quality organic thin film, and an electronic device and an electronic apparatus that are manufactured using the method and the device, an organic thin film-forming system includes a solution supplying unit, a gas supplying unit, a soft ionizing unit, and an ion separating unit, a deflecting unit, and a film-forming unit. After organic materials to be converted in film become minute liquid droplets in the soft ionizing unit and the liquid droplets are ionized or charged, the liquid droplets are vaporized and thus pseudo-molecular ions of a vapor state are created. In the ion separating unit, an organic material pseudo-molecular ion is separated from the pseudo-molecular ions. A predetermined stick voltage is applied to a plurality of electrodes formed on a substrate of an electronic device forming the organic thin film using a circuit previously formed on the substrate and thus the organic material pseudo-molecular ion is selectively stuck to a predetermined electrode.

7 Claims, 9 Drawing Sheets

METHOD FOR FORMING FILM, METHOD OF MANUFACTURING ELECTRONIC DEVICE, FILM FORMING SYSTEM, ELECTRONIC DEVICE, AND ELECTRONIC APPARATUS

BACKGROUND OF THE INVENTION

1. Field of Invention

The present invention relates to a method to form a film, a film forming system, and an electronic device and an electronic apparatus that are manufactured using the method and the device.

2. Description of Related Art

In the related art, there exists electronic devices, such as organic EL displays and organic TFTs, in which an organic thin film having a thickness of 1 μm or less is used. In general, the organic thin film is formed using different methods depending on whether the organic material forming the organic thin film is formed of a polymer system organic material or a small molecule system organic material. For example, in the case of organic EL display devices, an organic thin film formed of a polymer system organic material is formed using an ink jet method (see Japanese Patent No. 3036436) or a spin coating method, and an organic thin film formed of a small molecule system organic material is formed using a vacuum vapor deposition method (see Japanese Unexamined Patent Application Publication No. 11-126691).

SUMMARY OF THE INVENTION

However, the ink jet method has problems, such as a discharge error of organic material ink from an ink head or non-uniform precision of an ejected region. In addition, the vacuum vapor deposition method has problems, such as low precision and short life span of a shadow mask that is used for deposition, or low utilization efficiency of the organic material. For these reasons, in related art film-forming methods, such as the ink jet method or the vacuum vapor deposition method, it is difficult to form a high quality thin film providing high quality characteristics while efficiently using materials.

The present invention is directed to addressing such problems. Accordingly, the present invention provides a method and system to form a film and an electronic device and an electronic apparatus that are manufactured using the method and the device, in which materials can be efficiently used and a form having a film thickness of about several tens nm to several hundreds nm or a size of 1 mm or less can be controlled with high precision, thereby forming a high-quality thin film with high production efficiency.

In an aspect of the present invention, a method to form a film includes converting and creating a material into a pseudo-molecular ion of a vapor state, and setting potentials of a plurality of electrodes disposed on a substrate to predetermined values and selectively sticking the pseudo-molecular ion on the substrate.

According to the method, the material is altered to minute liquid droplets and the liquid droplets are vaporized after/while ionizing or charging the liquid droplets. In addition, a pseudo-molecular ion of a vapor state by vaporizing and charging the liquid droplets is created. Thus, a material pseudo-molecular ion is separated from the pseudo-molecular ions and is stuck to the substrate.

At this time, by selectively setting a predetermined portion of the substrate to a predetermined potential, the material pseudo-molecular ion is induced to the predetermined portion using static electricity. Thus, the material can assuredly be stuck to the predetermined portion. In this way, it is possible to reliably form a high-quality organic thin film in a desired portion.

In an aspect of the present invention, a method of manufacturing an electronic device in which a functional material is made into thin films and layered on a substrate including a plurality of electrodes, includes altering a solution including the functional material into minute liquid droplets and ionizing or charging the liquid droplets, and then creating a pseudo-molecular ion of a vapor state by vaporizing the liquid droplets, reducing or removing the content of solvent ions originated from a solvent included in the solution from the pseudo-molecular ions, and selectively setting potentials of a plurality of electrodes to different potentials for the pseudo-molecular ions, and selectively sticking the pseudo-molecular ions of the functional materials to the substrate.

According to the method, the functional material is altered to a solution and is then altered to minute liquid droplets, thereby ionizing pseudo molecules. In addition, the ionized functional material and the solution ion are separated from the pseudo-molecular ions and the functional material, which is ionized to the pseudo-molecular ions and is then separated, and are stuck to the substrate. At this time, by selectively setting a predetermined portion of the substrate to a predetermined potential, the functional material of a pseudo-molecular ionized state is induced to the predetermined portion. Thus, the functional material can assuredly be stuck to the predetermined portion. In this way, it is possible to form a high-performance device in a desired portion.

A method of manufacturing an electronic device may include, after separating the solvent pseudo-molecular ions from the pseudo-molecular ions and the functional material pseudo ions originated from the functional material, reciprocally deflecting the functional material pseudo ions.

According to the method, after the solvent ions and the functional material ions are separated by the separating unit, a beam scanning area can be increased as ion density is uniform in the beam area of the pseudo-molecular ionized functional material emitted as a plurality of beams.

In a method of manufacturing an electronic device, a plurality of electronic devices are formed on the substrate and the selective potential of the plurality of electrodes formed in each of the electronic devices is set by signal lines and power supply lines that are commonly used for each of the electronic devices.

According to the method, the plurality of electronic devices formed on the substrate can simultaneously and selectively set respective potentials of the plurality of electrodes to predetermined values using the signal line and power supply line that are commonly used for the electronic devices. Therefore, it is possible to simultaneously form organic thin films for the plurality of electronic devices formed on the substrate.

In a method of manufacturing an electronic device, the signal line and the power supply line that are commonly used for each of the electronic devices formed on the substrate are wired in such a way as not to cross to each other in the middle region between the electronic devices formed on the substrate.

According to the method, since the signal line and power supply line formed on the substrate are wired not to intersect, they can be formed using one wiring layer. Therefore, high reliability and low manufacturing cost can be obtained, as compared to a case in which the signal line and the power supply line are connected using a plurality of wiring layers.

In a method of manufacturing an electronic device, setting circuits to selectively set predetermined potentials for the plurality of electrodes are formed on formation regions of the electronic devices formed on the substrate. The setting circuit uses at least one portion of the original electronic circuit of the electronic devices formed on the formation regions.

According to the method, since the film-forming voltage setting circuit formed on the substrate uses a portion of the original electronic circuit of the electronic devices, the voltages of the element electrodes can be set by including an additional circuit in the original electronic circuit of the electronic device. The additional circuit may be manufactured and included during the manufacturing process of the original circuit without the need for an additional manufacturing process.

In such a method, the electronic devices formed on the formation regions on the substrate are electro-optical devices, the plurality of electrodes are element electrodes of the plurality of electro-optical elements formed in the electro-optical devices. The electronic circuit used in the setting circuit includes element driving circuits of the electro-optical elements.

According to the method, since the film-forming voltage setting circuit to form the electro-optical device on the substrate uses a portion of the electronic circuit of the electro-optical device, the voltages of the element electrode can be set only by including an additional circuit in the original circuit of the electro-optical devices. The additional circuit may be manufactured and included during the manufacturing process of the original circuit without the need for an additional manufacturing process.

A film forming system to form a film of a material on a substrate includes an ionizing unit, which alters the material or a solution of the material to minute liquid droplets, ionizes or charges the liquid droplets, vaporizes the liquid droplets and creates pseudo-molecular ions of a vapor state; a voltage supplying unit, which supplies a signal or a voltage to an electronic circuit that selectively sets potentials of a plurality of electrodes included on the substrate for the pseudo-molecular ions; and a film-forming unit, which sticks a material ion included in the pseudo-molecular ions to the substrate.

According to the system, the ionizing unit, which alters the material to minute liquid droplets, ionizes or charges the liquid droplets, and creates the pseudo-molecular ions of a vapor state by vaporizing the liquid droplets, is included and the materials of a pseudo-molecular ion state created in the ionizing unit are bonded to the substrate. At this time, by selectively setting a predetermined portion of the substrate to a predetermined potential, the material of a pseudo-molecular ion state is induced to the predetermined portion. Thus, the material can assuredly be stuck to the predetermined portion. In this way, the film forming system that can form a high-quality film in a desired portion can be provided.

The film forming system may include a solution supplying unit, which supplies a solution obtained by mixing the material and a solvent to the ionizing unit; a gas supplying unit, which alters the solution to minute liquid droplets by simultaneously ejecting the solution and an inert gas from a nozzle; and a separating unit, which creates pseudo-molecular ions of a vapor state by vaporizing the minute liquid droplets and separates ions originated from the material and ions originated from the solvent of the pseudo-molecular ions.

According to the system, the material is altered to a solution with a solvent in the solution supplying unit. The material altered to the solution is altered to fine liquid droplets. The liquid droplets are ionized or charged and vaporized, thereby creating pseudo-molecular ions of a vapor state. The separating unit, which separates the solvent ions from the pseudo-molecular ions, to thus separate only the ionized material, is included. In addition, the ionized material, which is separated in the separating unit, is induced and stuck to the substrate. As a result, it is possible to greatly reduce the possibility of the penetration of impurities of the material stuck to the substrate. Therefore, it is possible to provide a system to form a film that can form a high-quality film in a desired portion.

The film forming system includes a deflecting unit that reciprocally deflects the ions originated from the material, which are separated by the separating unit.

According to the system, a beam scanning area can be increased as ion density is uniform in the beam area of the ionized material that is separated in the separating unit.

In the film forming system, the separating unit includes a mass separating unit including a plurality of electrodes to separate the ions originated from the material based on the mass thereof according to an applied voltage or current.

According to the system, the ionized material, the solvent ion, and other ions can be separated by including the mass-separating device. Thus, the degree of purity of the material can be enhanced and the material can be produced as an ion beam having a uniform molecular amount.

In the film forming system, the mass separating unit includes a plurality of mass separating units, where distances between the plurality of electrodes are different.

According to the system, since the ion collecting performance and the ion separating performance of the mass separating device can be controlled separately, it is possible to perform mass separation and ion beam control with high precision.

In the film forming system, a collector electrode may be provided. An adjusting electrode that adjusts the flying speed of the ions originated from the material may be disposed between the collector electrode and the film-forming unit.

According to the system, it is possible to further include a collector electrode and exchange the potential between the collector electrode and the film-forming unit with the potential of the collector electrode. Therefore, it is possible to stick the ionized material to the substrate with optimal conditions.

In the film forming system, a detecting unit is provided. The detecting unit detects the amount of ions originated from the material and stuck to predetermined electrodes of the substrate.

Thereby, it can control the thickness of the film formed on the substrate while easily monitoring the thickness.

In the film forming system, an ion sticked electrode surface of the substrate is positioned vertically or horizontally downwardly and the substrate is slidable.

Thereby, it can reduce or prevent dust (particles) from sticking to the substrate when forming the film.

In the film forming system, the ionizing unit, the separating unit, and the film-forming unit include an isolating device for independent decompressing.

Thereby, it can independently decompress the ionizing unit, the separating unit, and the film-forming unit.

An electronic device according to an aspect of the present invention is manufactured using a method of manufacturing an electronic device.

Thereby, for example, a large and high-quality display device can be manufactured using a method of manufacturing the electronic device.

An electronic apparatus according to an aspect of the present invention includes the electronic device.

Thereby, for example, a portable apparatus can be implemented using a device manufactured by the device of manufacturing the device. The portable apparatus is, for example, a thin-type TV or a display-attached portable apparatus to make a large and high-quality display possible.

An electronic device according to an aspect of the present invention is manufactured using the device to form a film.

Thereby, since it can precisely control the thickness or the form using the electronic device manufactured using the device to form a film, a high-quality film can be formed with high production efficiency.

BRIEF DESCRIPTION OF THE DRAWINGS

FIG. 3(*b*) is a sectional schematic of the second 4-pole mass separating device;

FIG. 4(*b*) is a sectional schematic of the first 4-pole mass separating device;

DETAILED DESCRIPTION OF EXEMPLARY EMBODIMENTS

First Exemplary Embodiment

Hereinafter, a first exemplary embodiment according to the present invention is described in detail with reference to FIGS. 1 to 8. In addition, in this exemplary embodiment, an organic thin film-forming system is a thin film-forming system to form an organic thin film that includes pixels of an organic EL display that can display full colors. An organic EL display manufactured using the organic thin film-forming system according to the present exemplary embodiment includes pixels, each of which includes pixels for red (R), green (G), and blue (B).

Figure 1:
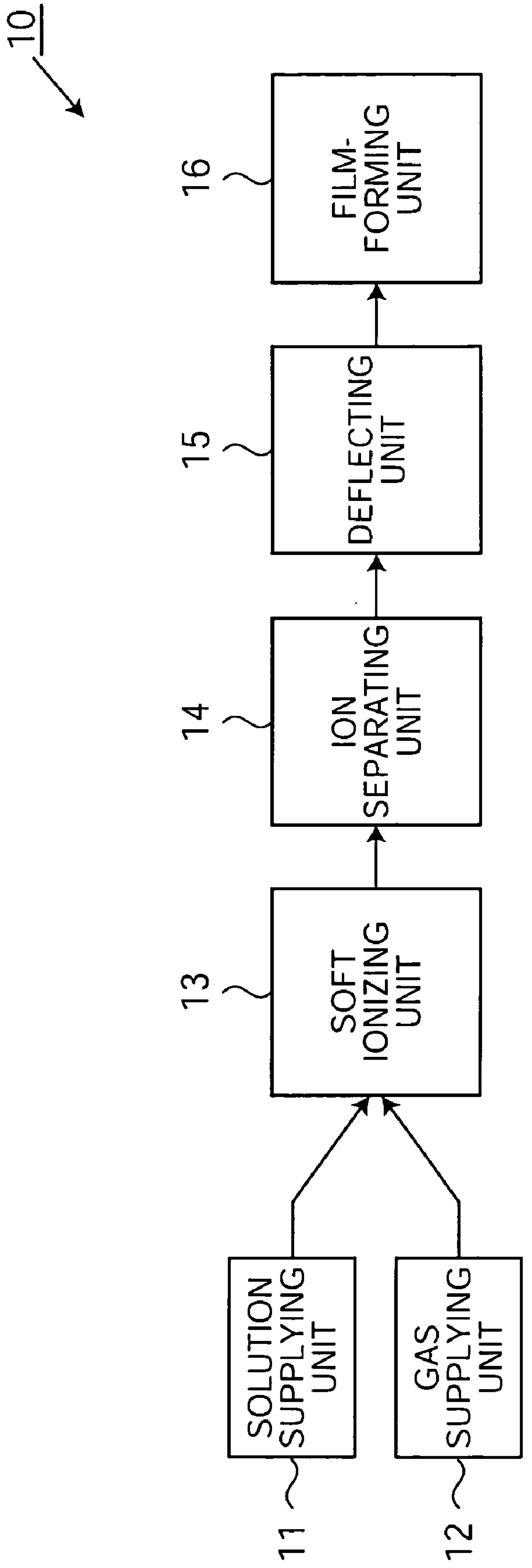
FIG. 1 is a block schematic for explaining a configuration of an organic thin film-forming system according to the present exemplary embodiment.

FIG. 1 is a schematic for explaining a configuration of an organic thin film-forming system. As shown in FIG. 1, an organic thin film-forming system 10 includes a solution supplying unit 11, a gas supplying unit 12, a soft ionizing unit 13, an ion separating unit 14, a deflecting unit 15, and a film-forming unit 16.

Figure 2:
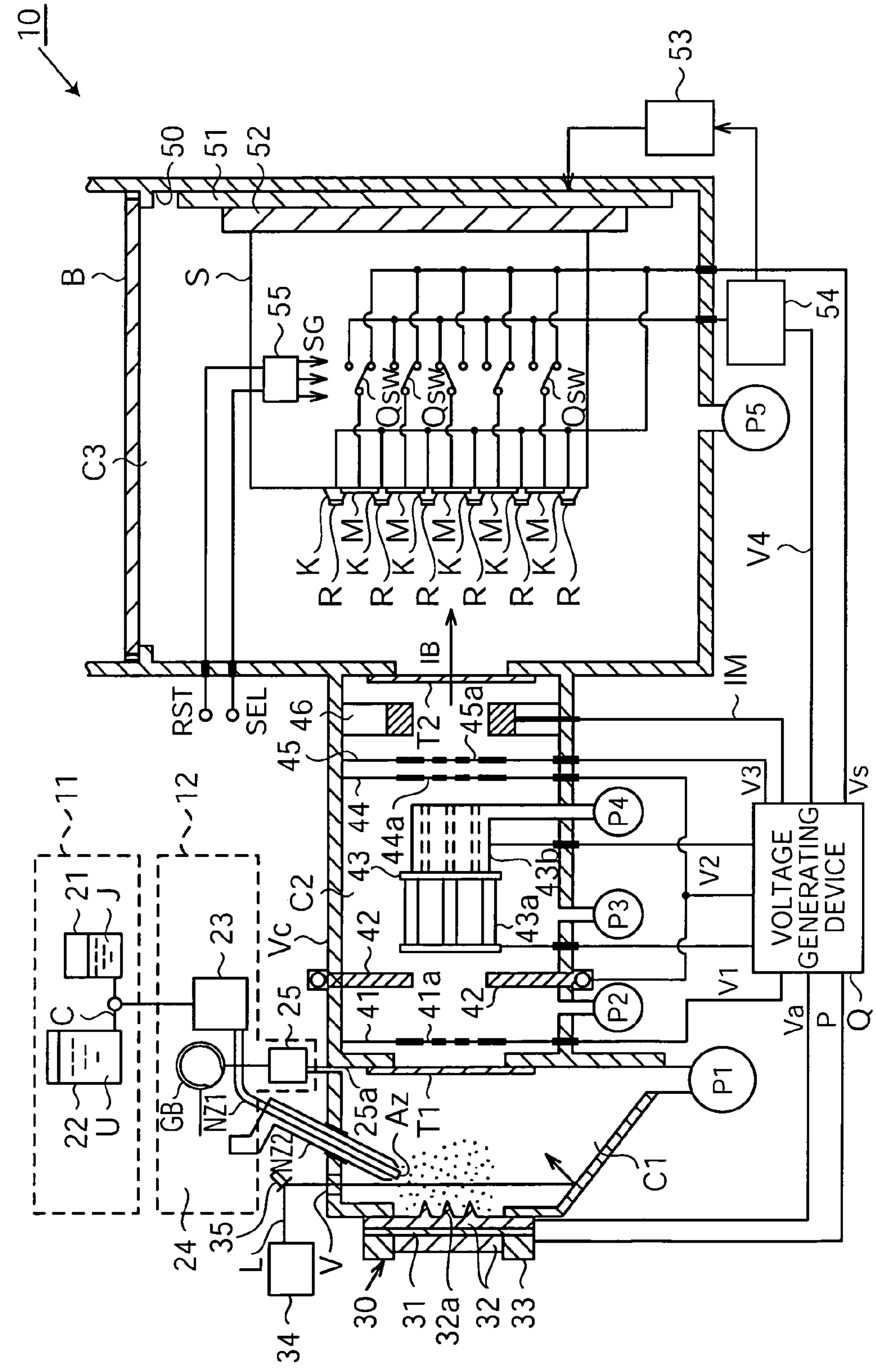
FIG. 2 is a schematic of an organic thin film-forming system according to the present exemplary embodiment.

The solution supplying unit 11 may use various organic materials J (see FIG. 2). The various organic materials J include different materials for each of red, green and blue, and are materials to form a light emitting layer, an electron carrying layer and a hole injecting/carrying layer with relation to each color. In the solution supplying unit 11, a solution dissolved in a solvent U (see FIG. 2) is produced.

The gas supplying unit 12 includes an inert gas tank and a pump that supplies the inert gas. In addition, the gas supplying unit 12 ejects the inert gas towards the soft ionizing unit 13 as a next unit thereof at high speeds along an outer peripheral part of a solution capillary through which the solution produced in the solution supplying unit 11 is injected and then ejected.

After altering solutions supplied from the solution supplying unit 11 and the gas supplying unit 12 into fine liquid droplets and ionizing or charging the liquid droplets, the soft ionizing unit 13 vaporizes the liquid droplets to create pseudo-molecular ions of a vapor state. Thereafter, the pseudo-molecular ions are induced to the ion separating unit 14 as a next unit thereof, using static electricity. In addition, the pseudo-molecular ions include ions of molecules in themselves, and also ions created by ionizing or charging chemical species created as the molecules and atoms cluster, collect, or combine.

The ion separating unit 14 collects and separates the pseudo-molecular ions created in the soft ionizing unit 13 as a previous unit, and converts the pseudo-molecular ions into an ion beam having uniform mass. At this time, the content of the solvent ion in the pseudo-molecular ions is reduced. After separating the solvent ion and an organic material ion of the organic materials J from the pseudo-molecular ions, the ion separating unit 14 outputs the ion beam to the deflecting unit 15 as a next unit. In addition, the deflecting unit 15 reciprocally deflects the organic material ion output from the ion separating unit 14.

The deflecting unit 15 reduces density non-uniformity of the ion beam and enlarges a sectional area of the ion beam by reciprocally deflecting the functional material ion. The film-forming unit 16 sticks the ion beam that undergoes the deflecting unit 15 to a mother substrate S (see FIG. 2) and stacks to form a predetermined organic thin film.

Hereinafter, an organic thin film-forming system 10 having members 11 to 16 described above is described in detail with reference to FIGS. 2 to 4. FIG. 2 is a structural view of the organic thin film-forming system 10 according to the present exemplary embodiment.

In FIG. 2, the organic thin film-forming system 10 includes a solute tank 21 and a solvent tank 22. The solute tank 21 stores the organic materials J to form various thin films, such as a light emitting layer, an electron carrying layer, an electron injecting layer, a hole carrying layer, and a hole injecting layer that constitute pixels formed on the mother substrate S. In addition, in the solute tank 21, the organic materials J are stored with high concentration dissolved. The organic materials J may be soluble π-conjugated polymer group organic materials constituting the light emitting layer, e.g., derivatives from polythiophene (PAT) group, polyparaphenylene (PPP), (poly) paraphenylenevinylene (PPV), a polyphenylene group, a polyfluorene (PF) group, and a polyvinylecarbazole group. In addition, the small molecule organic material may be compounds, such as rubrene that is soluble in a benzene derivative, venylene, 9 or 10-diphenylanthracene, tetraphenylbutadiene, Nile red, coumalin 6, and quinacridon or denthrima series compounds. In addition, organic materials forming the hole injecting/carrying layer may be, for example, PEDOT+PSS group metal complexes, polyaniline+PSS group metal complexes, and phthalocyanine group metal complexes.

The solvent tank 22 stores the solvent U that dilutes the various organic materials J.

The solvent U may be xylen, benzene, toluene, tetrahydrofuran, dichlorobenzene, methylethylketone, dioxane, water alcohols, such as methanol or ethanol, fluorine alcohols, such as hexafluoro-2-propanol, acetone, N-methylvinylidone, dimethylformamide, and dimethylsulfoxide and the most suitable one for the solute (the organic materials J) is selected. The solvent U stored in the solvent tank 22 may not be the same type as the solvent used in the solution of the solute tank 21.

The solute tank 21 and the solvent tank 22 are connected to each other through a carrying pipe C and the carrying pipe C is connected to a rectifying pump 23. In addition, a diluted solution, in which the organic materials J are diluted by the solvent U at a predetermined ratio, is supplied to the rectifying pump 23 via the carrying pipe C.

The organic thin film-forming system 10 includes the gas supplying unit 12 that has the rectifying pump 23, a carrier gas pump 24, a gas tank GB, and a heated gas pump 25.

A capillary NZ1 is connected to the rectifying pump 23. In the capillary NZ1, a gas guide pipe NZ2 is installed at the periphery of the capillary NZ1 and on the same axis as the capillary NZ1. If necessary, a heater may be installed at a front end Az of the capillary NZ1 to heat the end Az. The gas guide pipe NZ2 is connected to the carrier gas pump 24. The carrier gas pump 24 is connected to the gas tank GB. The gas tank GB is filled with high-purity helium gas (He), an inert gas such as nitrogen ($N_2$) or argon (Ar), or carbon dioxide ($CO_2$). In terms of costs, it is desirable to use nitrogen ($N_2$) or carbon dioxide ($CO_2$). An injection nozzle including the capillary NZ1 and the gas guide pipe NZ2 is inserted into an ionizing chamber C1 of a chamber Vc. A first vacuum pump P1 is connected to the ionizing chamber C1. Through the operation of the first vacuum pump P1, pressure inside the ionizing chamber C1 can be independently decompressed.

The rectifying pump 23 injects the diluted solution supplied from the solution supplying unit 11 through the carrying pipe C into the ionizing chamber C1 through the capillary NZ1 with a steady flow, i.e., non-pulsating flow. Then the diluted solution becomes fine liquid droplets in the form of mist and is provided to the ionizing chamber C1. The carrier gas pump 24 injects the inert gas supplied from the gas tank GB from the outer peripheral portion of the diluted solution injected from the capillary NZ1 into the ionizing chamber C1 having decompressed pressure through the gas guide pipe NZ2 at high speeds near sonic speeds.

As a result, the injected diluted solution becomes fine liquid droplets of 1 μm or less. Since friction occurs between the minute liquid droplets and molecules of the inert gas forming the carrier gas, the minute liquid droplets are ionized or charged. In the present exemplary embodiment, the minute liquid droplets are ionized to anions.

The heated gas pump 25 is connected to the gas tank GB. An outlet 25*a* of the heated gas pump 25 is connected to the ionizing chamber C1. The heated gas pump 25 exhausts the heated inert gas through the outlet 25*a*. Thus, the minute liquid droplets are altered into the pseudo-molecular ions of a vapor state by vaporizing the created minute liquid droplets, and cooling of the front end Az of the capillary NZ1 or an front end of the gas guide pipe NZ2 in the vicinity of the end Az due to the adiabatic expansion is reduced or prevented when the inert gas is injected from the gas guide pipe NZ2 into the ionizing chamber C1 in a decompressed pressure. By cooling of the front end Az of the capillary NZ1, the diluted solution at the front end Az is coagulated and fixed, thereby reducing or preventing degradation of injection capability of the nozzle. As a result, it is possible to stably control the injection amount of the diluted solution injected from the capillary NZ1.

An ultrasonic fogger 30, to which a strong electric field electrode is attached, is provided in the ionizing chamber C1. The ultrasonic fogger 30, to which a strong electric field electrode is attached, includes an ultrasonic vibrator 31, vibration plate electrodes 32, and a peltier element 33.

The ultrasonic vibrator 31 formed of piezoelectric material is inserted into and supported by a pair of vibration plate electrodes 32. The peltier element 33 is connected to the ultrasonic vibrator 31. The vibration plate electrodes 32 and the peltier element 33 are connected to a voltage generator Q installed at the outer side of the chamber Vc. Although not shown in FIG. 2, a vibration control device that supplies a high-frequency voltage causing vibration of the ultrasonic vibrator 31 is connected to the ultrasonic vibrator 31. A voltage Va higher than a first voltage V1 of an inductive electrode voltage by several kVs, which will be explained later, is supplied to the vibration plate electrodes 32 from the voltage generator Q. The vibration plate electrodes 32 are formed of metal having high anti-corrsion, such as stainless steel or titanium, or conductive ceramic, such as a silicon-nitride group, a boride titanium ($TiB_2$) group, and a boride zirconium ($ZrB_2$) group. A plurality of protrusions 32a are formed on the surface of the vibration plate electrodes 32, so that charges can be easily emitted from the front ends of the protrusions. The peltier element 33 cools the ultrasonic vibrator 31 using a current P supplied from the voltage generator Q, so that it can reduce or prevent the ultrasonic vibrator 31 from degrading due to heat generation caused by vibration of the ultrasonic vibrator 31.

The ultrasonic fogger 30, to which the strong electric field electrode is attached, is installed at a sidewall of the ionizing chamber C1 such that it faces at an incline toward the surface of the injection nozzle including the capillary NZ1 and the gas guide pipe NZ2. Among the fine liquid droplets injected from the injection nozzle, the liquid droplets having relatively large mass, collide with the vibration plate electrodes 32 that vibrate, become finer liquid droplets, and are soft ionized by being charged by a high voltage applied to the protrusions.

The organic thin film-forming system 10 may include a laser oscillator 34 that outputs a wavelength (ultraviolet or infrared) having a high absorption rate with respect to the solvent U and a low absorption rate with respect to the organic materials J. A laser L emitted from the laser oscillator 34 is reflected and scanned by a scan mirror 35 and is incident to the ionizing chamber C1 by way of an incident window V installed at a sidewall of the ionizing chamber C1. In addition, the laser L instantly heats and vaporizes the minute liquid droplets created by the injection nozzle or the vibration plate electrodes 32 together with the heated inert gas supplied from the heated gas pump 25, thereby creating the pseudo-molecular ions of a vapor state.

The injection nozzle, the ultrasonic fogger 30 to which the strong electric field electrode is attached, the heated gas pump 25, and the laser oscillator 34, and the vacuum pump P1 constitute the soft ionizing unit 13.

A first shutter T1 is installed at a sidewall of the ionizing chamber C1 between the ultrasonic fogger 30 and an inductive electrode 41. By opening the first shutter T1, the pseudo-molecular ions are introduced to an ion separating chamber C2 adjacent to the ionizing chamber C1.

Relationships among a flying speed (v), an acceleration voltage (E), the number of charges (Z), and a mass (m) of an ion and charge (e) of an electron can be expressed as follows.

$$v=(2eZE/m)^{1/2}$$

From the equation, we can easily appreciate that the difference of the flying speed (v) of ions is significantly large if the mass (m) of ions and the number of charge (Z) of ions largely change. Thus it is easy to separate a specific ion.

The ion separating chamber C2 is independently isolated from the ionizing chamber C1 and a film-forming chamber C3 by the first shutter T1 and a second shutter T2. The second to fourth vacuum pumps P2, P3, and P4 are installed in the ion separating chamber C2.

The inductive electrode 41, a cooling electrode 42, a multi-pole separating/collecting device 43, a collector electrode 44, an adjusting electrode 45, and a deflecting magnet 46 are included in the ion separating chamber C2. Respective functional devices 41 to 46 are positioned in an order of the inductive electrode 41, the cooling electrode 42, the multi-pole separating/collecting device 43, the collector electrode 44, the adjusting electrode 45, and the deflecting magnet 46 from the ionizing chamber C1.

The inductive electrode 41 includes a plurality of grids 41*a* in a portion corresponding to the opening of the first shutter T1. The inductive electrode 41 is connected to the voltage generator Q installed at the outer side of the ion separating chamber C2. The first voltage V1 generated by the voltage generator Q is supplied to the inductive electrode 41. The first voltage V1 is a positive high voltage with respect to the voltage V*a* of the vibration plate electrode 32 making up the ultrasonic fogger 30. The pseudo-molecular ions inside the ionizing chamber C1 are electrically induced to the inductive electrode 41 by the inductive electrode 41 and is thus introduced into the ion separating chamber C2. At this time, by providing the grids 41*a*, moving direction and speed of the pseudo-molecular ions that pass through the first shutter T1 and are introduced from the ionizing chamber C1 are determined.

The cooling electrode 42 has open holes in portions corresponding to the grids 41*a* of the inductive electrode 41. The cooling electrode 42 is electrically connected to the voltage generator Q. A second voltage V2 is applied to the cooling electrode 42, the second voltage V2 being a negative voltage with respect to the first voltage V1 generated in the voltage generator Q. Thus, the solute ions having high molecular weights are collected toward the center of an orbit. The cooling electrode 42 is connected to a cooling device installed at the outer side of the ion separating chamber C2 and is cooled by the cooling device.

By providing the cooling electrode 42 having the aforementioned configuration, among the pseudo-molecular ions that pass through the grids 41*a* of the inductive electrode 41, solvent pseudo-molecular ions (solvent ion) that have low molecular weights and can be easily diffused are removed by dewing. The removed solvent is collected and reused. Thus, the ratio of solute ions (functional material ions) in a flow of the pseudo-molecular ions is increased, thereby alleviating the burden of separation of the multi-pole separating/collecting device 43 as a next unit. The pseudo-molecular ions are introduced into the multi-pole separating/collecting device 43 as a next unit.

In the present exemplary embodiment, the multi-pole separating/collecting device 43 provides two first and second 4-pole mass separating devices 43*a* and 43*b* that are disposed in series. Specifically, among the two first and second 4-pole mass separating devices 43*a* and 43*b* which are arranged in series, the first 4-pole mass separating device 43*a* is installed at the upper side, i.e., the cooling electrode 42, and the second 4-pole mass separating device 43*b* is installed at the lower side, i.e., the collector electrode 44 as a next unit.

Figure 4:
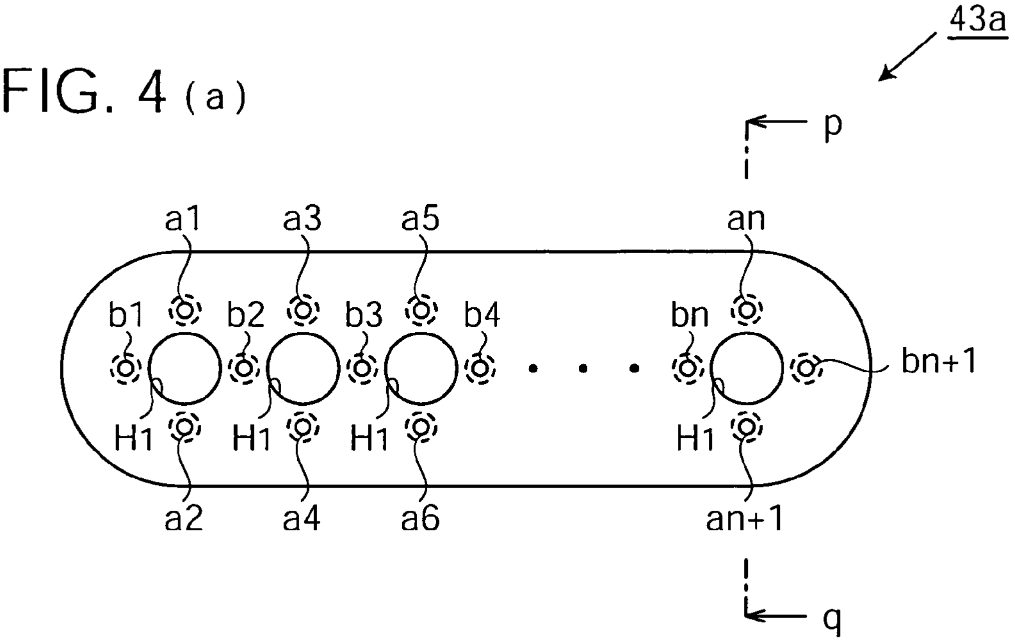
FIG. 4(*a*) is a schematic of a first 4-pole mass separating device.
Figure 4:
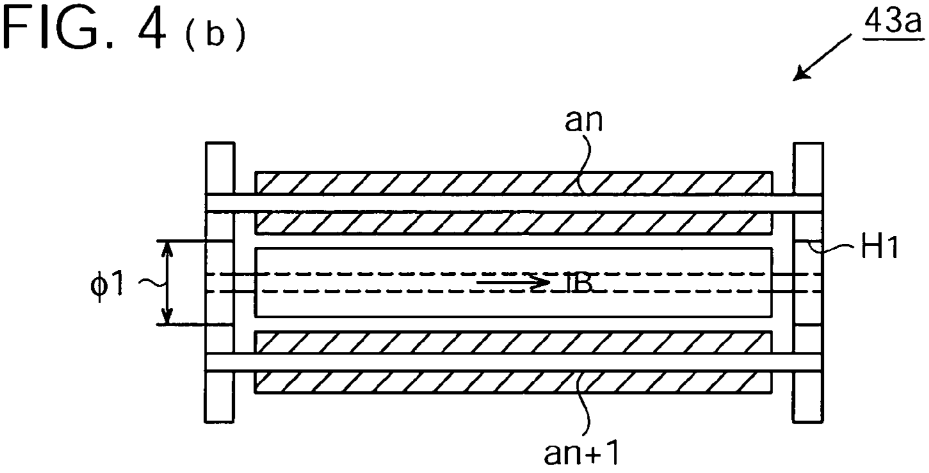

FIG. 4(*a*) is a schematic of the first 4-pole mass separating device 43*a*. FIG. 4(*b*) is a sectional schematic of the first 4-pole mass separating device 43*a*. As shown in FIG. 4(*a*), in the first 4-pole mass separating device 43*a*, two pairs of circular electrodes (an, an+1) and (bn, bn+1) (n is a natural number) facing each other are finely mounted in parallel. Inverse direct current voltage and alternating current voltage are overlapped and applied to two pairs of circular electrodes (an, an+1) and (bn, bn+1). An ion beam through hole (H1) is formed on a portion, which is surrounded by respective two pairs of electrodes (an, an+1) and (bn, bn+1). The pseudo-molecular ions that pass through the grids 41*a* pass through the ion beam through hole H1 of the first 4-pole mass separating device 43*a*, thereby separating the solvent pseudo-molecular ion (solvent ion) and the solute ion (ionized organic material) that constitute the pseudo-molecular ions.

Figure 3:
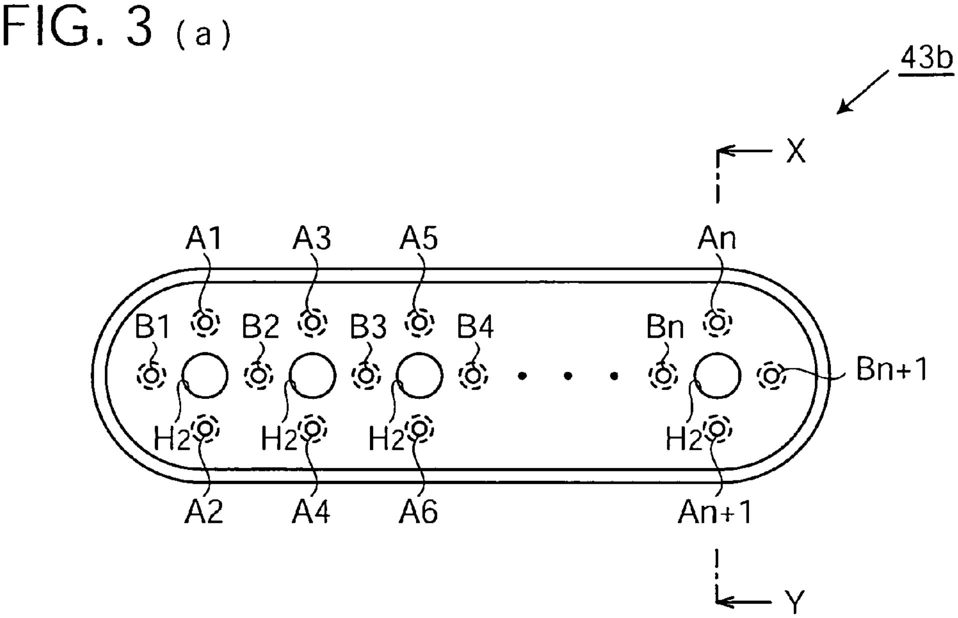
FIG. 3(*a*) is a schematic of a second 4-pole mass separating device.
Figure 3:
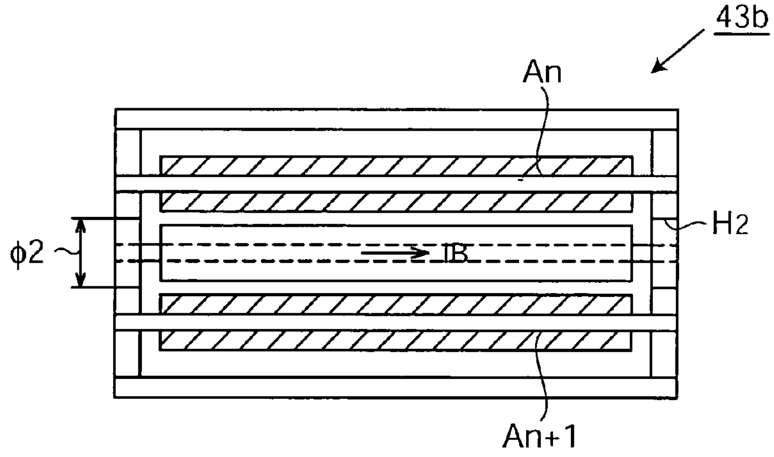

FIG. 3(*a*) is a schematic of the second 4-pole mass separating device 43*b*. FIG. 3(*b*) is a sectional schematic of the second 4-pole mass separating device 43*b*. As shown in FIG. 3(*a*), in the second 4-pole mass separating device 43*b*, two pairs of circular electrodes (An, An+1) and (Bn, Bn+1) (n is a natural number) facing each other are finely mounted in parallel. Inverse direct current voltage and alternating current voltage are overlapped and applied to respective two pairs of electrodes (An, An+1) and (Bn, Bn+1). An ion beam through hole H2 is formed on a portion, which is surrounded by respective two pairs of electrodes (An, An+1) and (Bn, Bn+1). The pseudo-molecular ions ejected from the ion beam through hole H1 of the first 4-pole mass separating device 43*a* pass through the ion beam through hole H2 of the second 4-pole mass separating device 43*b*, thereby separating the solvent pseudo-molecular ion (solvent ion) and the solute ion (ionized organic material) that constitute the pseudo-molecular ions. By optimizing the direct current and alternating current voltages applied to the circular electrodes (An, An+1) and (Bn, Bn+1) having supporting members at the center, the solvent ions constituting the pseudo-molecular ions are seceded from an ion orbit surface thereof and the remaining salute ions are collected on the ion orbit surface, thereby arranging a pseudo-molecular ion beam primarily separated. In the present exemplary embodiment, the pseudo-molecular ion beam is referred to as an ion beam IB (see FIG. 3(*b*)). In addition, a diameter ϕ2 of the ion beam through hole H2 of the second 4-pole mass separating device 43*b* is smaller than a diameter ϕ1 of the ion beam through hole H1 of the first 4-pole mass separating device 43*a* (see FIG. 4(*b*)).

The first 4-pole mass separating device 43*a* is an open 4-pole mass separating device that has no container. Thus, the solvent ion can be easily emitted from the pseudo-molecular ions that pass through the inductive electrode 41 to the outside of the 4-pole mass separating device 43*a*.

However, the second 4-pole mass separating device 43*b* is a closed 4-pole mass separating device, and a fourth vacuum pump P4 is connected to an opening hole of the container of the second 4-pole mass separating device 43*b*. By operating the fourth vacuum pump P4, the second 4-pole mass separating device 43*b* is maintained at a high vacuum state. As a result, it is possible to obtain the multi-pole separating/collecting device 43 that can simultaneously separate a large amount of ion and create an ion beam long.

As shown in FIG. 2, the collector electrode 44 has grids 44*a* in a portion corresponding to the ion beam through hole H2 of the multi-pole separating/collecting device 43. The collector electrode 44 is electrically connected to the voltage generator Q. A voltage having the same level as that of the second voltage V2 supplied to the cooling electrode 42 is supplied to the collector electrode 44. The collector electrode 44 electrically pulls in the ion beam IB formed by the multi-pole separating/collecting device 43 and causes the ion beam IB to pass through the grids 44*a*. The ion beam IB that passes through the grids 44*a* is introduced to the adjusting electrode 45 as a next unit.

The adjusting electrode 45 is electrically connected to the voltage generator Q. A third voltage V3 is supplied to the adjusting electrode 45 from the voltage generator Q. The third voltage V3 is used to optimally control a potential difference between the adjusting electrode 45 and the mother substrate S independently of the first voltage V1 and the second voltage V2 and is set to stably attach the ion beam IB to a predetermined portion of the mother substrate S. As a result, it is possible to optimally control an incident speed of the ion beam IB to the film-forming unit 16. The incident speed may be low enough to bend the orbit of the ion beam IB by a non-stick voltage Vs and a stick voltage V4.

As such, the ion separating unit 14 includes the inductive electrode 41, the cooling electrode 42, the multi-pole separating/collecting device 43, the collector electrode 44, and the adjusting electrode 45.

The deflecting magnet 46 is installed at a lower portion of the adjusting electrode 45. The deflecting magnet 46 is electrically connected to the voltage generator Q. The deflecting magnet 46 is an electromagnet that generates a deflecting magnetic field by supplying period fluctuation exciting current according to current IM supplied from the voltage generator Q. By passing the ion beam IB through the period fluctuation magnetic field generated by the deflecting magnet 46, the ion beam IB is waved and the uniformity of the beam density is enhanced. The deflecting magnet 46 may be the deflecting unit 15. The deflecting magnet 46 may be a beam deflecting device using the static electric field.

The second shutter T2 is installed at a partition wall facing grids 45*a* of the adjusting electrode 45 in the downstream of the ion separating chamber C2. By opening the second shutter T2, the ion beam IB is introduced to the film-forming chamber C3 adjacent to the ion separating chamber C2.

The film-forming chamber C3 may be in an independent airtight state by the second shutter T2 and a gate B. A fifth vacuum pump P5 is installed in the film-forming chamber C3. By operating the fifth vacuum pump P5 while the second shutter T2 and the gate B are closed, the pressure in the film-forming chamber C3 can be decompressed.

A stage sliding device 51 and a stage 52 are installed in the film-forming chamber C3. The stage sliding device 51 is installed at a sidewall of the film-forming chamber C3. Specifically, the stage sliding device 51 is mounted at a sidewall 50 facing the second shutter T2.

The stage sliding device 51 is controlled by a stage controller 53 installed at the outer side of the film-forming chamber C3. The stage sliding device 51 is designed such that sliding of the stage 52 is controlled along the sidewall 50 of the film-forming chamber C3 by the stage controller 53.

The stage 52 is mounted on the stage sliding device 51. The mother substrate S is fixedly mounted on the stage 52. Sliding of the mother substrate S is controlled by the stage controller 53 through the stage 52 along the sidewall 50 of the film-forming chamber C3. As such, by mounting the mother substrate S along the sidewall 50 of the film-forming chamber C3, it is possible to reduce or prevent dust from sticking to the mother substrate S. As a result, a high-quality organic thin film can be formed on the mother substrate S. The organic thin film-forming system 10 shown in FIG. 2 is rotated at an angle of 90° so that an organic thin film-forming surface of the mother substrate S is directed vertically and sliding of the mother substrate S can be controlled on the stage controller 53. In this case, it is also possible to reduce or prevent dust from sticking to the mother substrate.

The mother substrate S includes at least one display panel tip PT in which a pixel circuit, that is an electronic circuit to previously control pixels, is formed in a matrix. Specifically, switching transistors Qsw that include TFTs, organic TFTs, integrated circuits (IC), and the like and function as switching elements, are formed on the mother substrate S, as shown in FIG. 2. The switching transistors Qsw and conductive lines ML connected to the switching transistors Qsw are electrically insulated by insulator layer ZL. A plurality of banks K, that is, partition walls which separate pixels, are formed at predetermined intervals on the mother substrate S towards the second shutter T2 side. Among respective banks K, transparent pixel electrodes M are previously formed of indium-tartar oxide (ITO). In addition, a conductive film R is formed on each of the banks K. It is not necessary to form the banks K before formation of an organic thin film, but the banks K may be formed after formation of the organic thin film or may not be formed. However, the conductive film R may be formed between the pixel electrodes M before formation of the organic thin film.

The pixel electrodes M may be electrically connected to the voltage generator Q by the switching transistors Qsw that constitute the pixel circuit. The non-stick voltage Vs is supplied to the pixel electrodes M from the voltage generator Q. The non-stick voltage Vs is supplied to the conductive film R formed on each of the banks K. The potential of the pixel electrode M that is selectively connected to the voltage generator Q by the switching transistor Qsw is the same as that of the conductive film R formed on each of the banks K.

The pixel electrodes M may be electrically connected to the stick voltage V4 output from the voltage generator Q by the switching transistor Qsw making up a pixel circuit through a current detecting system 54 installed at the outer side of the film-forming chamber C3. The ion beam IB is projected to the pixel electrodes M electrically connected to the current detecting system 54 and thus current flows through a circuit formed of the pixel electrodes M and the voltage generator Q. By detecting a level of the current, it is possible to estimate the amount of ion beam IB projected to the pixel electrodes M. The current detecting system 54 outputs a signal corresponding to the amount of organic materials J attached to the pixel electrodes M to the stage controller 53 and the rectifying pump 23. Therefore, it is possible to easily and precisely estimate the thickness of the organic thin film formed on the pixel electrodes M.

The current detecting system 54 is connected to the stage controller 53 that controls sliding of the mother substrate S. In addition, the stage controller 53 controls of the sliding speed of the mother substrate S according to the level of the current detected by the current detecting system 54. As a result, it is possible to effectively and uniformly form the organic thin film having a predetermined thickness over the entire surface of the pixel electrodes M.

As shown in FIG. 2, a selection control circuit 55 is formed on the mother substrate S to control the switching transistors Qsw. The selection control circuit 55 operates using the stick voltage V4 and the non-stick voltage Vs as a power supply, includes a count circuit and a decoder circuit that discriminates the output of the count circuit, and outputs a control signal SG that controls the potential of the pixel electrodes M to one of the stick voltage V4 and the non-stick voltage Vs according to input of a reset signal RST and a selection signal SEL supplied from the outer side of the film-forming chamber C3. Once the reset signal RST is supplied to the selection control circuit 55 that controls circuits and the switching transistors Qsw on the mother substrate S, the selection control circuit 55 is initialized and outputs a control signal SG to electrically connect all the pixel electrodes M to the stick voltage V4 of the voltage generator Q by the switching transistors Qsw. Next, once pulses of the selection signal SEL are input to the selection control circuit 55, the selection control circuit 55 outputs the control signal SG to electrically connect some of the pixel electrodes M to the stick voltage V4, which is supplied from the voltage generator Q through the amount-of-current detecting system 54, by the others of the switching transistors Qsw and electrically connecting the remaining pixel electrodes M to the non-stick voltage Vs of the voltage generator Q by the remaining switching transistors Qsw.

However, the stick voltage V4 has the highest potential among those of electrodes of the organic thin film-forming system 10. In addition, it is preferable that the non-stick voltage Vs may be equal to or less than the third voltage V3 applied to the adjusting electrode 45.

Next, pulses of the selection signal SEL are input to the selection control circuit 55 again. Then the stick voltage V4 is applied to some of the pixel electrodes M through the current detecting system 54 according to the selection signal SEL. The non-stick voltage Vs supplied from the voltage generator Q is applied to the remaining pixel electrodes M and the conductive films R of the banks K. As a result, the ion beam IB is only induced to only the predetermined pixel electrodes M connected to the current detecting system 54 and the organic material pseudo-molecular ions can be sticked to the predetermined pixel electrodes M. By setting the selection control circuit 55 to select predetermined electrodes every time when the selection signal SEL is input to the selection control circuit 55, the ion beam IB is selectively induced to predetermined pixel electrodes M and the organic material pseudo-molecular ions can be stuck to the predetermined pixel electrodes M.

By the driving of the stage sliding device 51, the mother substrate S mounted onto the stage 52 slides to position predetermined pixel electrodes M to a portion facing the grids 45*a*. At this time, as described above, the predetermined pixel electrodes M are electrically connected to the stick voltage V4 through the current detecting system 54 and the non-stick voltage Vs is applied to the remaining pixel electrodes M and the conductive films R formed on the banks K. Thus, the organic material pseudo-molecular ions can be stuck to the predetermined pixel electrodes M.

In addition, the film-forming unit 16 includes the stage sliding device 51, the stage 52, the stage controller 53, and the current detecting system 54.

As such, after the organic materials J are dissolved in the solvent U and ionized to the pseudo-molecular ions, the solvent ion is separated from the pseudo-molecular ions and only the organic material ion is stuck to the mother substrate S. In addition, by applying a voltage to induce the ionized organic materials J to a predetermined portion of the mother substrate S, the organic materials J can be stuck to a desired portion, resulting in the efficient use of the organic materials J. At this time, since the solvent ion is separated and only the organic materials J are stuck to the mother substrate S after the organic materials J are dissolved in the solvent U and ionized to the pseudo-molecular ions, it is possible to reduce or prevent impurities from being absorbed. Therefore, a high-purity thin film having a predetermined uniform thickness can be formed on a desired portion.

Hereinafter, a method of manufacturing a display panel of an organic EL display formed using the organic thin film-forming system 10 as described above will be described.

Figure 5A:
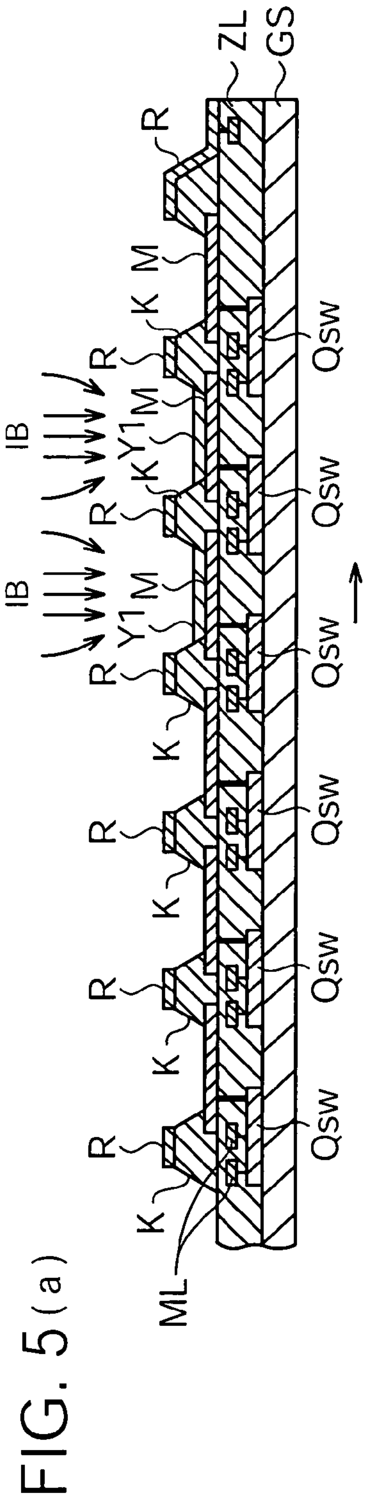
FIG. 5(*a*), FIG. 5(*b*), and FIG. 5(*c*) are sectional schematics of an organic EL display panel formed using the organic thin film-forming system.
Figure 5B:
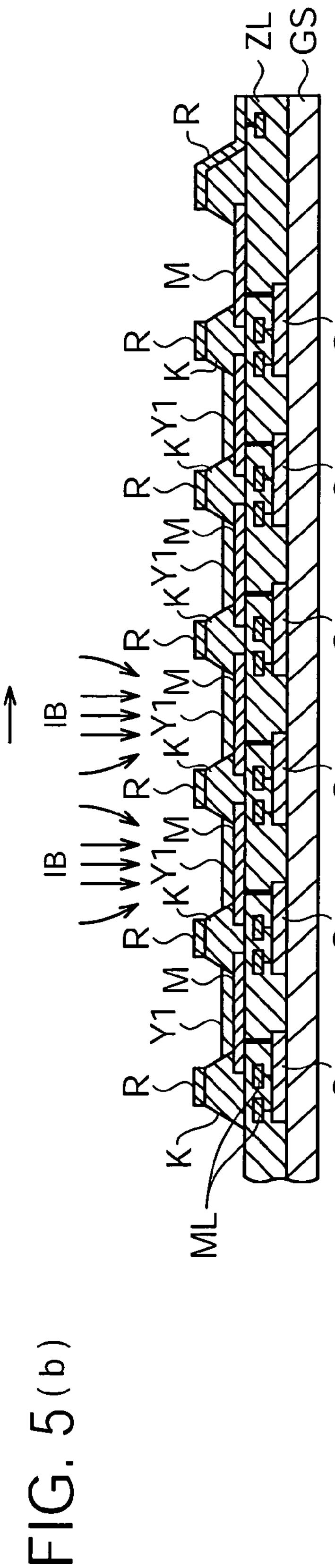
Figure 5C:
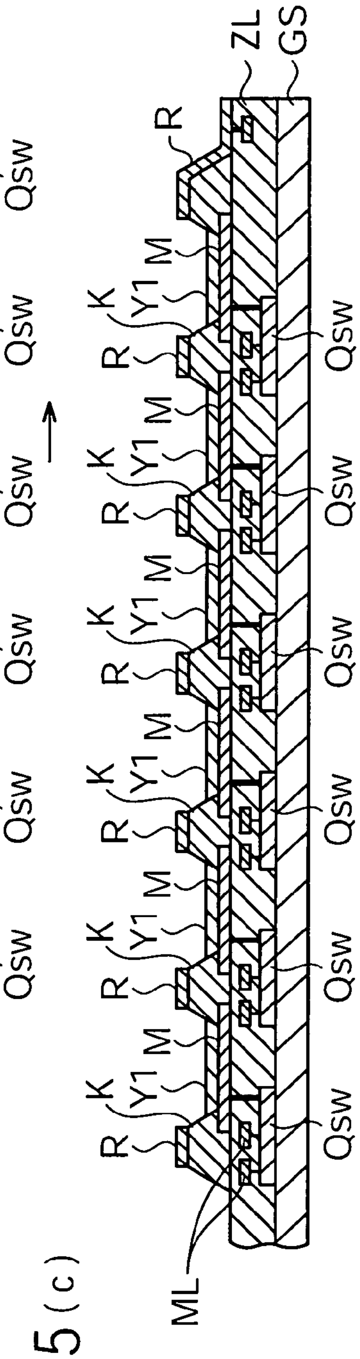
Figure 6:
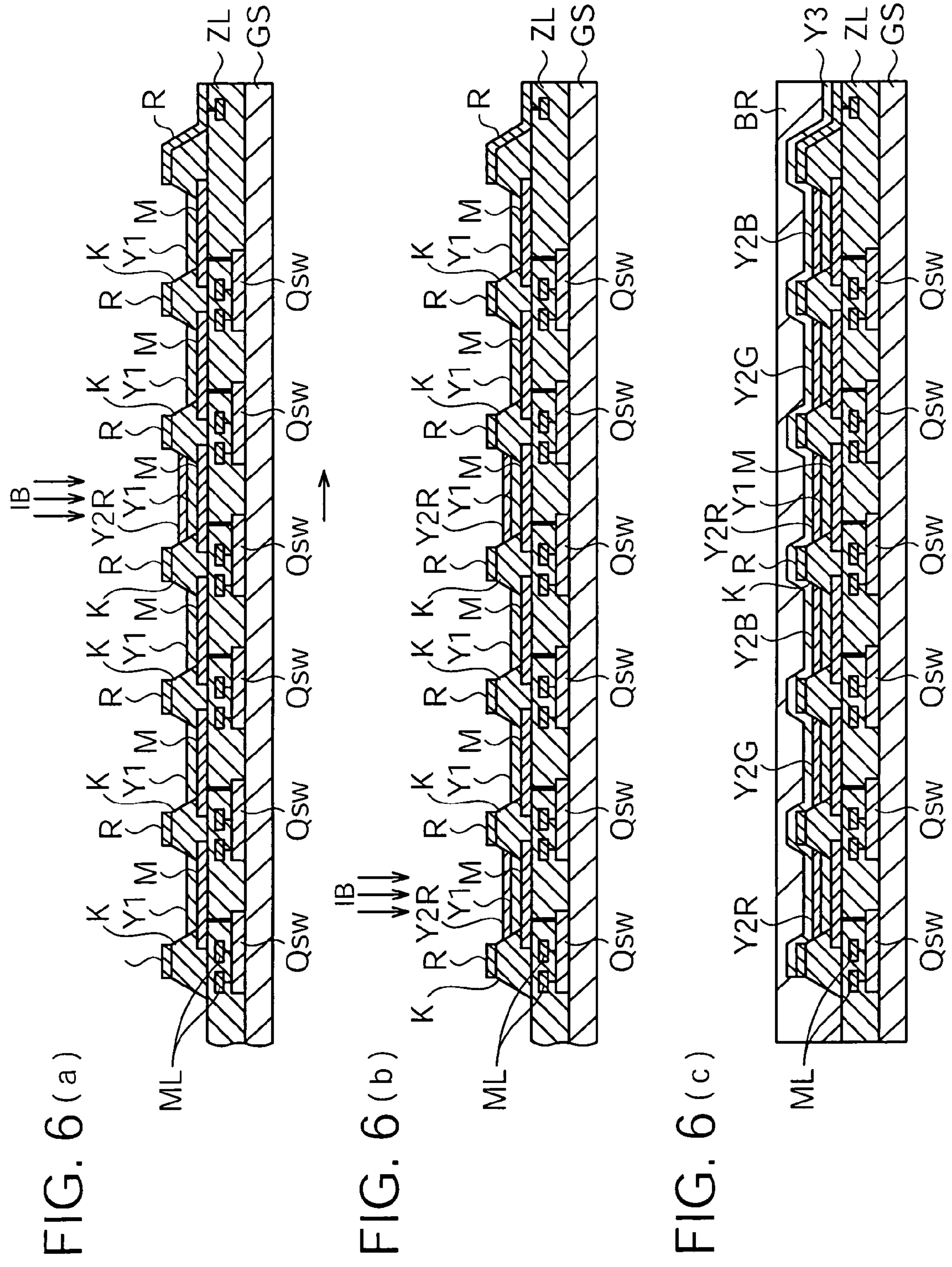
FIG. 6(*a*), FIG. 6(*b*), and FIG. 6(*c*) are sectional schematics of an organic EL display panel formed using the organic thin film-forming system.

FIGS. 5 and 6 are sectional schematics of an organic EL display formed using the organic thin film-forming system 10. In FIGS. 5 and 6, pixels having the same reference numeral refer to pixels having the same color.

Figure 7:
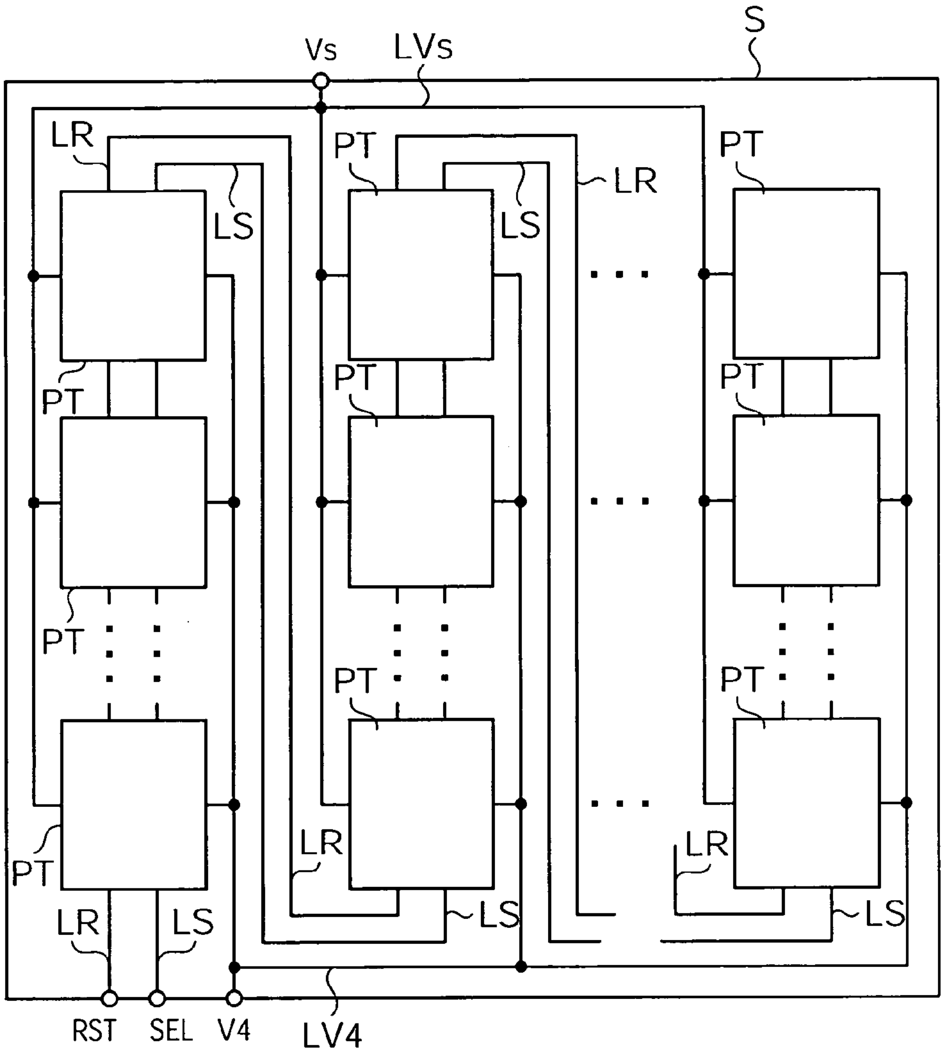
FIG. 7 is a schematic of a connection relationship when a plurality of display panel tips are formed on a mother substrate at a time.

FIG. 7 is a layout to dispose each of a plurality of display panel tips PT, when the plurality of display panel tips PT are formed on the mother substrate S, such that a reset signal line LR, a select signal line LS, a stick voltage line LV4, and a non-stick voltage line LVs are not crossed to each other. Thus, since the display panel tips PT enter the same internal state in response to a reset signal RST and the selection signal SEL simultaneously, sticking of the solvent ion to the mother substrate S can be performed continuously. In addition, when the display panel tips PT are implemented on a chip, the reset signal line LR, the select signal line LS, the stick voltage line LV4, and the non-stick voltage line LVs may be made of conductive wiring materials whose scribe sections are not easily corroded or contact holes be interposed. For example, the conductive wiring materials having high anti-corrosion, such as ITO or titanium nitride (nitride Ti).

As shown in FIG. 7, the reset signal line LR, the select signal line LS, the stick voltage line LV4, and the non-stick voltage line LVs are wired such that they do not intersect in middle regions between regions of the mother substrate S on which the display panel tips PT are formed. Accordingly, the reset signal line LR, the select signal line LS, the stick voltage line LV4, and the non-stick voltage line LVs may be formed using one wiring layer. In this case, when compared to a case where the reset signal line LR, the select signal line LS, the stick voltage line LV4, and the non-stick voltage line LVs are formed using a plurality of layers on the mother substrate S, it is possible to wire the lines using the optimal wiring layer among wiring layers forming an original circuit without additional new manufacturing processes, thereby satisfying both reliability and cost.

First, the gate B is opened while the second shutter T2 is closed, and the mother substrate S is disposed on the stage 52. Next, the fifth vacuum pump P5 operates, produces a predetermined degree of vacuum, and thus removes oxygen or moisture. At the same time, sliding of the stage 52 is controlled to position the mother substrate S such that predetermined pixel electrodes M formed on the mother substrate S face the grids 45*a* of the adjusting electrode 45. In the case of polymer organic EL display panels, a hole injecting/carrying layer, to be primarily formed, is commonly formed on all the pixel electrodes M. Therefore, at this time, the switching transistors Qsw are controlled according to the control signal SG supplied from the selection control circuit 55 and all the pixel electrodes M are electrically connected to the stick voltage V4 through the current detecting system 54. On the other hand, the non-stick voltage Vs supplied from the voltage generator Q is applied to the conductive film R formed on each of the banks K. Since the banks K are formed to surround each pixel, the conductive film R formed on each of the banks K is electrically connected on each of the banks K.

In this state, when the second shutter T2 is opened, the ion beam IB of the organic materials J to form a hole injecting/carrying layer Y1 is projected from the second shutter T2 to the plurality of pixel electrodes M and is selectively stuck to the pixel electrodes M using static electricity (see FIG. 5(*a*)). Once the organic material pseudo-molecular ion is stuck to the pixel electrodes M, an electricity resistance of a portion of the pixel electrodes M to which the organic material pseudo-molecular ion is sticked increases and the organic material pseudo-molecular ion is may be stuck to a portion of the pixel electrodes M to which the organic material pseudo-molecular ion is not stuck. Thus, it is possible to obtain uniform thickness using magnetic matching. If the current detecting system 54 detects that it becomes a predetermined thickness, sliding of the stage 52 is controlled to move the mother substrate S such that the adjacent pixel electrodes M face the grids 45*a* of the adjusting electrode 45. At this time, the ion beam IB has already been projected, the ion beam IB is immediately projected to the adjacent pixels to be moved and film-forming starts. Similarly to the fist process, if the current detecting system 54 detects that it becomes a predetermined current value (film thickness), sliding of the stage 52 is controlled to move the mother substrate S such that the adjacent pixel electrodes M face the grids 45*a* (see FIG. 5(*b*)).

Thereafter, by repeating the above operations continuously, the hole injecting/carrying layer Y1 is sequentially formed on the entire pixel electrodes M (see FIG. 5(*c*)). As shown in FIG. 3(*a*), the width of the ion beam (113) can be equal to the length of one side of the mother substrate S by increasing the width of the multi-pole separating/collecting device 43 or the width of each of the grids 41*a*, 44*a*, and 45*a*. Alternatively, through a single stage scanning movement, the hole injecting/carrying layer Y1 may be formed with respect to all the pixels of the mother substrate S.

After the hole injecting/carrying layer is stuck to all the pixels, hole injecting/carrying organic molecules are stuck to the pixel electrodes M by performing annealing within a vacuum furnace.

When the hole injecting/carrying layer Y1 is formed on all the pixel electrodes M, a light emitting layer is formed using different organic materials J for each of emitting colors R, G, and B. First, an example of formation of the emitting color R will be described. In this case, a system having the same configuration as the organic thin film-forming system 10 of FIG. 2 is dedicated for each of the emitting colors, devices are connected in line, and then the mother substrate S is replaced with the organic thin film-forming system 10. The mother substrate S is moved between devices via the gate B. Formation processing is the same as that of the hole injecting/carrying layer Y1. The gate B is opened while the second shutter T2 is closed and then the mother substrate S is disposed onto the stage 52. Next, by operating the fifth vacuum pump P5 and producing a predetermined degree of vacuum, oxygen or moisture is removed. At the same time, sliding of the stage 52 is controlled to move the mother substrate S such that the predetermined pixel electrodes M formed on the mother substrate S face the grids 45*a* of the adjusting electrode 45. At this time, the switching transistors Qsw are controlled according to the control signal SG supplied from the selection control circuit 55 and the pixel electrodes M for the color R are electrically connected to the stick voltage V4 through the current detecting system 54. At this time, the switching transistors Qsw are controlled so that the non-stick voltage Vs supplied from the voltage generator Q is applied to the remaining pixel electrodes M and the conductive film R formed on each of the banks K.

In this state, once the second shutter T2 is opened, the ion beam 113 of the organic materials J forming a light emitting layer Y2R is projected to the plurality of pixel electrodes M from the second shutter T2 and thus the light emitting layer Y2R is formed (see FIG. 6(*a*)). In addition, once the predetermined current value (film thickness) is achieved by the current detecting system 54, sliding of the stage 52 is controlled to move the mother substrate S such that pixel electrodes M for the color R that are periodically disposed face the grids 45*a* of the adjusting electrode 45. At this time, since the switching transistors Qsw are controlled according to the control signal SG supplied from the selection control circuit 55 and the predetermined pixel electrodes M have already been electrically connected to the stick voltage V4 through the current detecting system 54, the ion beam 113 is directly projected to the predetermined pixel electrodes M and a predetermined organic material ion begins to be stuck.

When the predetermined thickness is detected by the current detecting system 54, sliding of the stage 52 is controlled to move the mother substrate S such that the pixel electrodes M for the color R that are periodically disposed face the grids 45*a* of the adjusting electrode 45. Thereafter, by sequentially performing the above processes, the light emitting layer Y2R is formed on the pixel electrodes M for the color R (see FIG. 6(*b*)). Then annealing performed at a predetermined temperature, thereby fixing the light emitting layer Y2R to the hole injecting/carrying layer Y1. At this time, annealing may be performed at a time after sticking respective light emitting organic materials to all the pixels R, G, and B.

Thereafter, the above processes are sequentially performed on the pixel electrodes M for the color B, thereby forming a light emitting layer Y2B on all the pixel electrodes M for the color B.

After forming the hole injecting/carrying layer Y1 and a light emitting layer Y2 by deposition on the pixel electrodes M, the mother substrate S is carried to adjacent another chamber by opening the gate B. Then in the chamber, an electrode Y3 and a sealing unit BR are formed on the light emitting layer formed by the organic thin film-forming system 10 using a predetermined process, e.g., a deposition method. In this way, the organic EL display panel is manufactured (see FIG. 6(*c*)).

Thereafter, as shown in FIG. 7, the mother substrate S on which the plurality of display panel tips PT are formed is scribe-processed, the display panel tips PT are separately cut, and thus made to be panels. A driver IC or display power supply circuit is mounted on each of the cut display panel tips PT, used as an organic EL display, and thus applied to various electronic apparatuses.

Figure 8:
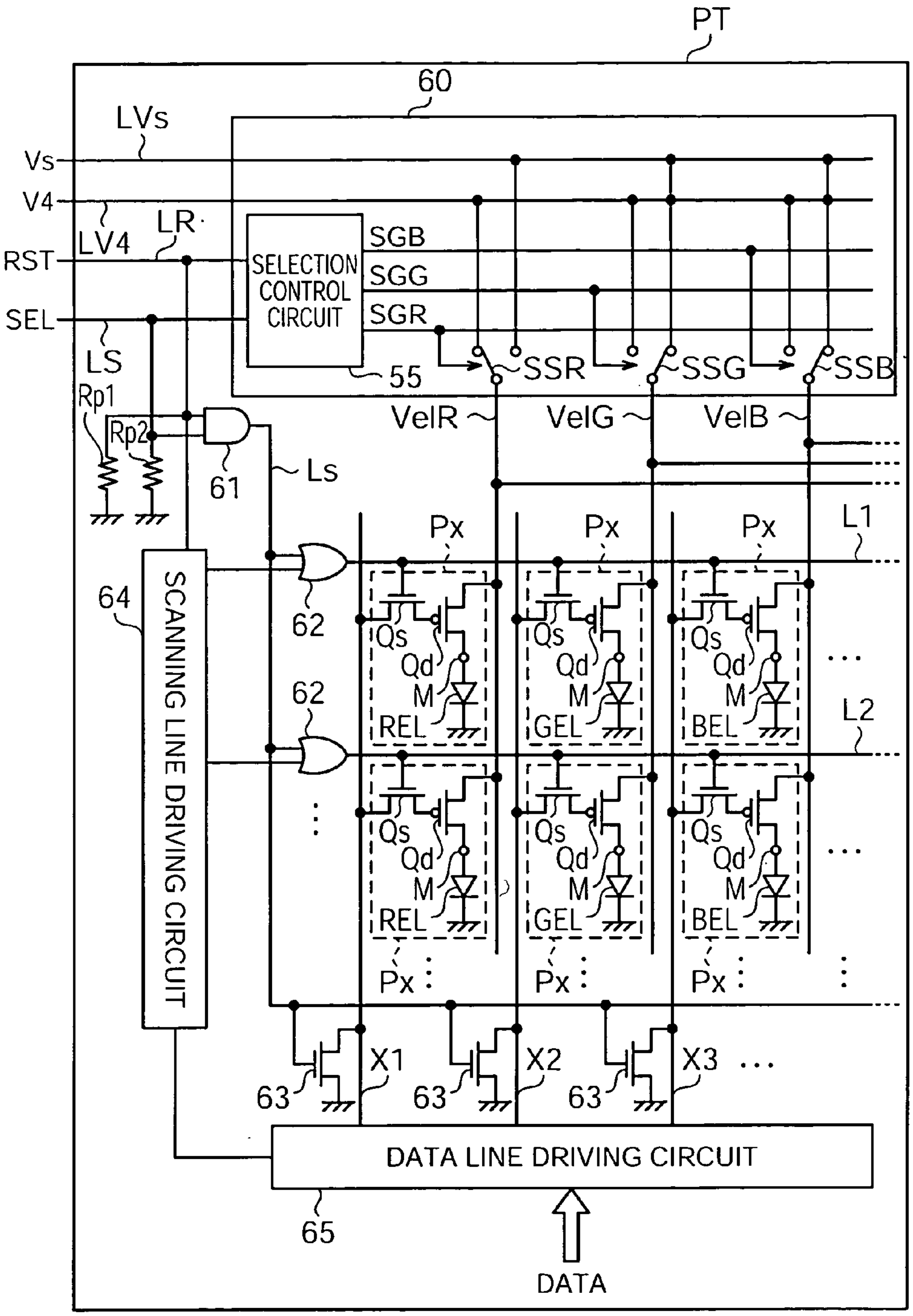
FIG. 8 is a schematic for explaining an electrical connection between a film forming voltage setting circuit and a display driving circuit in the display panel tips.

FIG. 8 is a schematic for explaining an example of an electronic connection relationship between a film-forming voltage setting circuit for selectively applying the potential of the pixel electrodes M (a voltage selection circuit 60, an AND circuit 61, OR circuits 62, and charging transistors 63) and a display driving circuit (a scanning line driving circuit 64, a data line driving circuit 65, and element driving circuits of pixels Px), in each of the display panel tips PT formed on the mother substrate S as shown in FIGS. 2 and 7. As shown in FIG. 8, in each of the display panel tips PT, a pixel electrode M is disposed in which a red (R) organic EL element REL, a green (G) organic EL element GEL, and a blue (B) organic EL element BEL corresponding to light emitting colors of each of the pixels Px are formed in stripe forms. Each organic EL element is formed using a manufacturing method described with reference to FIGS. 5 and 6. In each of the pixels Px, an element driving circuit including a select transistor Qs and a driving transistor Qd that drive an electrode of one of the organic EL elements (REL, GEL, BEL) is formed.

In each of the display panel tips PT, the voltage selection circuit 60 to apply the stick voltage V4 and the non-stick voltage Vs to the pixel electrode M is formed. The stick voltage V4 is input to the pixel electrode M through the stick voltage line LV4. The non-stick voltage Vs is input to the pixel electrode M through the non-stick voltage line LVs. The selection control circuit 55 is formed in the voltage selection circuit 60. The reset signal RST is input via the reset signal line LR to, and the select signal SEL is input via the select signal line LS to, the selection control circuit 55, the scanning line driving circuit 64, and the data line driving circuit 65.

The selection control circuit 55, the scanning line driving circuit 64, and the data line driving circuit 65 are initialized according to input of the reset signal RST. If the selection signal SEL is input during input of the reset signal RST, the selection signal SEL is output to the select signal line LS from the gate of the AND circuit 61 and a scanning signal is output to scanning lines L1, L2, . . . from the gate of the OR circuit 62.

Since data lines X1, X2, X3, . . . that transfer the output of the data line driving circuit 65 have high impedances during the input of the reset signal RST, if the selection signal SEL is input during input of the reset signal RST, the selection signal is output to the select signal line LS from the gate of the AND circuit 61, the charging transistor 63 is turned on, and thus all the data lines X1, X2, X3, . . . are set to ground potential.

As a result, the select transistors Qs of all the pixels Px are turned on, potential of the data lines X1, X2, X3, . . . is transferred to the gate of the driving transistor Qd, and thus the driving transistor Qd is turned on. Consequently, potential of one of the stick voltage V4 and the non-stick voltage Vs that can be selectively applied is supplied to all the pixel electrodes M through display driving power supply lines VelR, VelG, and VelB. At this time, since the organic EL elements (REL, GEL, and BEL) are not completed, current does not flow through the organic EL elements (REL, GEL, and BEL).

The selection control circuit 55 generates multiple states by counting the selection signal SEL in an internal count circuit in an initial state and outputs selection control signals SGR, SGG, and SGB. In other words, during the period from input of the reset signal RST to input of the selection signal SEL, the selection control circuit 55 is initialized and outputs all the selection control signals to select the stick voltage Vs. During formation of an organic thin film, the reset signal is continuously input.

If a first selection signal is input, the initial state of the selection control circuit 55 is released and the internal count circuit starts to count the selection signal SEL. The selection signal SEL is input in a predetermined organic thin film potential state from an external controller as many as the number of pulses included in each of element electrodes. Thus, each of the selection switches SSR, SSG, and SSB is switched and potential of one of the stick voltage V4 and the non-stick voltage Vs is output to the display driving power supply lines VelR, VelG, and VelB. A display driving power is supplied to the three element driving power supply lines from other terminals connected to the three element driving power supply lines during display operations. In FIG. 8, only the display driving power supply line VelR is electrically connected to the stick voltage line LV4 through the selection switch SSR. As a result, since the potential of the pixel electrode M is selectively set for the red (R) pixel, the green (G) pixel, and the blue (B) pixel among the pixels Px, the organic thin film to form each of the organic EL elements REL, GEL, and BEL may be formed on the pixel electrode M. Setting of a normal state is performed simultaneously for all the display panel tips PT shown in FIG. 7. At a stage where voltage setting for the element electrodes is prepared, the ion beam 113 is projected to the mother substrate S and thus the organic thin film is formed.

As such, one display panel tip PT is, or a plurality of display panel tips PT are, formed on the mother substrate S. The selective potential setting of the plurality of pixel electrodes M formed on the display panel tips PT is performed by the reset signal line LR, the select signal line LS, the stick voltage line LV4, and the non-stick voltage line LVs that are commonly used for the display panel tips PT. Thus, predetermined potential can be selectively and simultaneously set for the plurality of pixel electrodes M of each of the display panel tips PT and then the organic thin film can be formed on the element electrodes of the plurality of display panel tips PT.

In this exemplary embodiment, in a formation region of the display panel tip PT formed on the mother substrate S, the film-forming voltage setting circuit (the voltage selection circuit 60, the AND circuit 61, the OR circuits 62, and the charge transistor 63) and the display driving circuit (a scan line driving circuit 64, a data line driving circuit 65, and the element driving circuits of the pixels Px) are formed. In addition, the film-forming voltage setting circuit uses a portion of a circuit forming the original display panel tip PT.

The plurality of pixel electrodes M are the element electrodes of one of the organic EL elements REL, GEL, and BEL and the stick voltage V4 or the non-stick voltage Vs is supplied to each of the pixel electrodes M using the element driving circuits of each of the organic EL elements REL, GEL, and BEL, i.e., the select transistor Qs and the driving transistor Qd. Thus, the element driving circuit of the pixel Px does not need to make any change to supply a voltage to the element electrode in formation of the organic thin film. If a circuit is added to the original circuit of the display panel tip PT, voltage setting of the element electrode can be performed, and the additional circuit may be manufactured and included simultaneously with a manufacturing process of the original circuit.

In formation of the organic thin film, voltage supply to the film-forming voltage setting circuit and the display driving circuit is performed by appropriately changing the stick voltage V4 and the non-stick voltage Vs. At a stage where the display panel tip PT is completed, states of the film-forming voltage setting circuit and the display driving circuit are set according to the reset signal RST such that it is not necessary to supply a voltage from the stick voltage V4 and the non-stick voltage Vs. Similarly, the reset signal RST and the selection signal SEL are scribe-processed and the potential is fixed inside the display panel tip PT by pull-down resistors Rp1 and Rp2 in a display operation state.

In FIGS. 5 and 8, the voltage selection circuit 60 is formed on the mother substrate S, but may be formed as another external device.

Materials or functional materials correspond to the organic materials J in this exemplary embodiment. A substrate corresponds to the mother substrate S in this exemplary embodiment. An isolating device corresponds to the first shutter T1 or the second shutter T2 in this exemplary embodiment. A system to form a film corresponds to the organic thin film-forming system 10 in this exemplary embodiment. An ionizing unit corresponds to the soft ionizing unit 13 in this exemplary embodiment.

A separating unit corresponds to the ion separating unit 14 in this exemplary embodiment. A mass separating unit corresponds to the multi-pole separating/collecting device 43 in this exemplary embodiment. An electronic device corresponds to a major element of an organic EL display, i.e., the display panel tip PT in this exemplary embodiment. An ion stick electrode surface, an electrode or an element electrode corresponds to the pixel electrode M in this exemplary embodiment.

A voltage supply unit corresponds to the voltage generator Q in this exemplary embodiment. A detecting unit corresponds to the current detecting system 54 in this exemplary embodiment. A display driving circuit corresponds to the scanning line driving circuit 64, the data line driving circuit 65, or the element driving circuit of the pixel Px in this exemplary embodiment. An electrode device corresponds to the display panel tip PT in this exemplary embodiment. A signal line corresponds to the reset signal line LR or the select signal line LS in this exemplary embodiment. A power supply line corresponds to the stick voltage line LV4 or the non-stick voltage line LVs in this exemplary embodiment. An electro-optical element corresponds to the red (R) organic EL element REL, the green (G) organic EL element GEL, or the blue (B) organic EL element BEL in this exemplary embodiment.

According to the method of manufacturing the electronic device, such as the organic EL display panel, the organic thin film-forming system 10, and the electronic device in accordance with this exemplary embodiment, the following characteristics can be obtained.

(1) In the above exemplary embodiment, the organic thin film-forming system 10 including the solution supplying unit 11, the gas supplying unit 12, the soft ionizing unit 13, the ion separating unit 14, the deflecting unit 15, and the film-forming unit 16 is formed. After the organic materials J of the solution supplying unit 11 become minute liquid droplets and ionized or charged in the soft ionizing unit 13, the liquid droplets are vaporized and altered to the pseudo-molecular ions of a vapor state. At this time, the organic material ion is separated from the pseudo-molecular ions by the ion separating unit 14 and the ion beam IB is created using the orbit. The mother substrate S on which the pixel electrode M is previously formed is disposed on the stage 52. The predetermined pixel electrodes M are connected to the stick voltage V4 through the current detecting system 54 and the non-stick voltage Vs is applied to the remaining pixel electrodes M, thereby inducing the ion beam IB only to the predetermined pixel electrodes M in the electric fields. In this way, it is possible to precisely stick the organic material pseudo-molecular ion with a uniform thickness only to the predetermined pixel electrodes M using magnetic matching. Thus, it is possible to enhance utilization efficiency of the organic materials J when compared to a deposition method using a mask and to form a high-quality organic thin film whose thickness or pinhole hardly changes with respect to an electrode side of a complicated shape. When the organic material pseudo-molecular ion is stuck to the electrode, a solvent is removed by the ion separating unit 14. Therefore, the previously formed organic film is not dissolved again by the ion beam projected later and it is possible to stack a polymer thin film.

(2) In the above exemplary embodiment, the ionizing chamber C1 includes the ultrasonic vibrator 31, the vibration plate electrode 32, and the ultrasonic fogger 30 to which the strong electric field electrode including the peltier element 33 is sticked. The ultrasonic vibrator 31 ejects the solution through the capillary NZ1 in an ultrasonic vibrated state and the ejected minute liquid droplets are collided against the protrusions 32*a* formed on the vibration plate electrode 32. Thus, the size (mass) of the fine liquid droplets ejected from the capillary NZ1 can become finer liquid droplets.

(3) In the above exemplary embodiment, the laser oscillator 34 is included so that the laser L is projected to the charged fine liquid droplets ejected from the end Az of the capillary NZ1 through the laser-incoming window V installed at the sidewall of the ionizing chamber C1 and the solution included in the liquid droplets is instantly vaporized. Thus, the minute liquid droplets become finer liquid droplets and are vaporized, thereby ionizing the liquid droplets to the pseudo-molecular ions of a vapor state.

(4) In the above exemplary embodiment, the multi-pole separating/collecting device 43 including two first and second 4-pole mass separating devices 43*a* and 43*b* that are connected at multi-stages is included. The first 4-pole mass separating device 43*a* is an open type and the second 4-pole mass separating device 43*b* is a closed type. The fourth vacuum pump P4 is connected to the second 4-pole mass separating device 43*b* and the second 4-pole mass separating device 43*b* is used at a high degree of vacuum by operating the fourth vacuum pump P4. As a result, the separating performance or collecting performance of the multi-pole separating/collecting device 43 can be enhanced.

(5) In the above exemplary embodiment, the stick side of the mother substrate S is directed vertically or horizontally downwardly along the sidewall 50 of the film-forming chamber C3. Thus, it is possible to reduce or prevent dusts (particles) from sticking to the stick side of the mother substrate S. As a result, it is possible to form a high-quality organic thin film on the mother substrate S.

(6) In the above exemplary embodiment, the pixel electrode M is electrically connected to the stick voltage V4 through the current detecting system 54 installed at the outer side of the film-forming chamber C3 by the switching transistors Qsw. The organic material pseudo-molecular ion is stuck to the pixel electrode M that is electrically connected to the current detecting system 54, and thus current flows through the current detecting system 54 according to the amount of organic material pseudo-molecular ion. By measuring the level of the current, it is possible to monitor whether the organic film having a predetermined thickness is formed on the pixel electrode M.

In addition, the output signal line of the current detecting system 54 is connected to the stage controller 53 that controls sliding of the mother substrate S. In addition, the stage controller 53 controls sliding of the mother substrate S according to the current level measured by the current detecting system 54. As a result, it is possible to form the organic thin film having superior thickness precision or uniformity.

(7) In the above exemplary embodiment, a plurality of display panel tips PT are formed on the mother substrate S and selective potential setting of the pixel electrode M formed for each of the display panel tips PT is performed using the reset signal line LR, the select signal line LS, the stick voltage line LV4, and the non-stick voltage line LVs which are used commonly for each of the display panel tips PT. Thus, it is possible to selectively and simultaneously set the pixel electrode M of each of the display panel tips PT to a predetermined potential. As a result, it becomes possible to form the organic thin film at a time for the plurality of display panel tips PT formed on the mother substrate.

(8) In the above exemplary embodiment, the reset signal line LR, the select signal line LS, the stick voltage line LV4, and the non-stick voltage line LVs are wired not to cross in middle regions between regions of the mother substrate S on which the plurality of display panel tips PT are formed, as shown in FIG. 7. Thus, the reset signal line LR, the select signal line LS, the stick voltage line LV4, and the non-stick voltage line LVs may be formed using one wiring layer. It is possible to form the reset signal line LR, the select signal line LS, the stick voltage line LV4, and the non-stick voltage line LVs using the optimal wiring line among wiring layers forming the original circuit without additional manufacturing processes, thereby satisfying both reliability and cost-efficiency.

(9) In the above exemplary embodiment, the film-forming voltage setting circuit (the voltage selecting circuit 60, the AND circuit 61, the OR circuits 62, and the charging transistor 63) and the display driving circuit (the scanning line driving circuit 64, the data line driving circuit 65, and the element driving circuit of the pixels Px) are formed in a formation region of each of the display panel tip PT. In addition, the film-forming voltage setting circuit and the display driving circuit use a portion of a circuit element forming the original electro-optical device of the display panel tips PT formed on the formation region. In particular, since the element driving circuit of the pixels Px, which occupies the greater part of the display panel tip region, is not changed, the number of display panel tips that may be formed on the mother substrate at a time using the method to form an organic thin film an aspect of the present invention is hardly decreased. An increase in cost for circuits to apply the stick voltage to the pixel electrode M is relatively small.

Second Exemplary Embodiment

Next, an electronic device manufactured using the organic thin film-forming system 10 described in the first exemplary embodiment and an electronic device using the same will be described with reference to FIG. 9. An organic EL display may be one of organic thin film devices implemented using the organic thin film-forming system 10. The organic EL display may be applied to various electronic apparatus, such as mobile personal computers, cellular phones, digital cameras, and the like.

Figure 9:
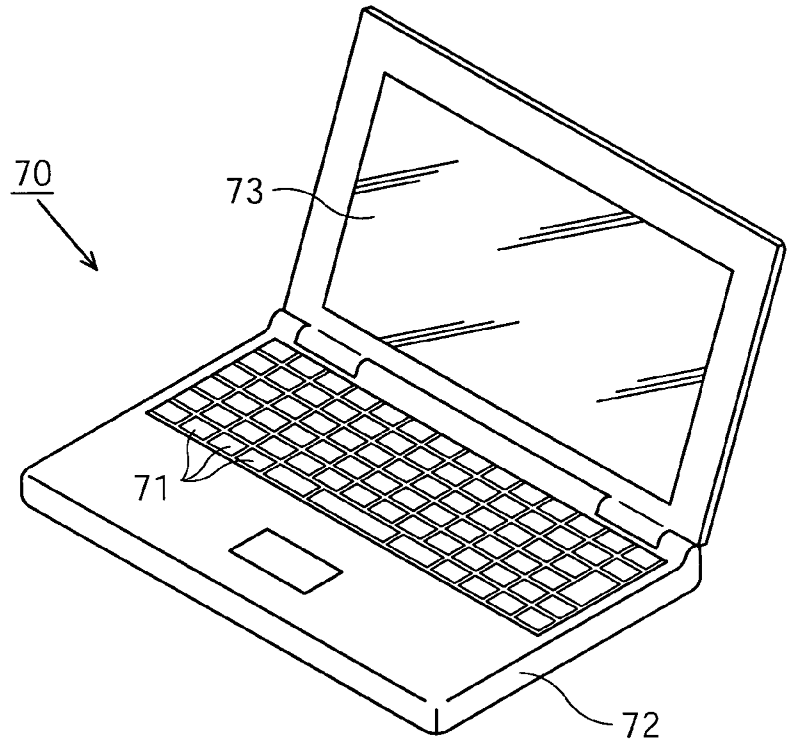
FIG. 9 is a view for explaining a second exemplary embodiment.

FIG. 9 is a schematic of a configuration of a mobile personal computer. In FIG. 9, a personal computer 70 includes a main body unit 72 including a keyboard 71 and a display unit 73 using a display formed of the organic EL element. In addition, in this case, the display unit 73 can be manufactured using the organic thin film-forming system 10. Therefore, it is possible to provide the mobile personal computer 70 including a high-quality organic EL display.

The exemplary embodiments of the present invention are not limited to the above exemplary embodiments and may be performed as follows.

In the first exemplary embodiment, the solvent U that dissolves the materials or functional materials, i.e., the organic materials J, is provided, the organic materials J are changed into a solution by mixing the organic materials J and the solvent U, and the organic materials J that are changed into the solution are ionized to the pseudo-molecular ions by the ionizing unit. By directly vaporizing the organic materials J or charging or soft ionizing separately nano-ionized corpuscles using a field desorption/field ionizing method, an electric shocking method, or a laser soft ionizing method, the same effect as the first exemplary embodiment can be obtained.

In the first exemplary embodiment, the multi-pole separating/collecting device 43 is provided in which the two first and second 4-pole mass separating devices 43*a* and 43*b* are connected at multiple stages and 4 poles are horizontally connected in parallel in the 4-pole mass separating device at each stage. Thus, a large amount of ions can be simultaneously separated and an ion beam having a large length can be produced. The multi-pole separating/collecting device 43 may include one 4-pole mass separating device. In this case, it is possible to reduce manufacturing cost of the organic thin film-forming system 10.

In the above exemplary embodiments, a thin film is formed on a hard substrate that is a glass substrate GS. However, the thin film is not necessarily formed on the glass substrate GS, but may be formed on a substrate formed of bendable materials, such as a plastic substrate, a complex material substrate, or a metal substrate. In addition, in this case, a stage sliding device is used that binds the substrate in a roll form and controls the bound substrate. Thus, it is possible to continuously and efficiently form the organic thin film.

In the first exemplary embodiment, the soft ionizing unit 13 includes a single ejection nozzle, but may include a plurality of ejection nozzles and stack different organic materials in a state where the mother substrate is inserted into the film-forming unit 16. Thus, it is possible to form a fine layered structure. In this case, it is necessary to appropriately change control conditions of the ionizing unit 14 and the deflecting unit 15 or increase the solution supplying unit 11 and the gas supplying unit 12 according to organic materials.

In the first exemplary embodiment, the pseudo-molecular ions include negative pseudo-molecular ions. However, in the case of positive pseudo-molecular ions, a potential relationship provided to each electrode is set direct inverse to the first exemplary embodiment. Thus, it is possible to embody the apparatus to form a film.

In the first exemplary embodiment, preferable effects are obtained by embodying the system to form a film that manufactures the organic EL display panel, but the system to form a film may be embodied as an organic TFT, an organic battery, an organic memory element, a system having a multi-layered organic thin film sealing structure, a color filter, or an optical communication receiving device besides from the kind of organic EL display panels. In this case, the organic materials may not be directly stuck to the electrode, but may be stuck to a thin insulating layer interposed between electrodes.

In the first exemplary embodiment, the system to form a film is embodied as a system to form an organic film, but may be embodied as an apparatus to form an inorganic film. The system to form a film may be embodied as a system for forming a film formed of combination of an inorganic thin film or a small molecule organic thin film and a polymer organic thin film that can be vapor deposited.

What is claimed is:

1. A method to forming a film, comprising:

converting and creating a material of pseudo-molecular ions and solvent ions of a vapor state;

reducing the content ratio of solvent ions to pseudo-molecular ions originated from a solvent included in the solution from the pseudo-molecular ions; and setting potentials of a plurality of electrodes disposed above a substrate to predetermined values and selectively sticking the pseudo-molecular ions to the substrate.

2. A method of manufacturing an electronic device in which a functional material is converted into thin films and layered on a substrate including a plurality of electrodes, the method comprising:

altering a solution including the functional material into minute or fine liquid droplets and ionizing or charging the liquid droplets, and then creating pseudo-molecular ions and solvent ions of a vapor state by vaporizing the liquid droplets;

reducing the ratio of solvent ions to pseudo-molecular ions; and selectively setting potentials of a plurality of electrodes to different potentials for the pseudo-molecular ions, and selectively sticking pseudo-molecular ions of the functional materials to the substrate.

3. The method of manufacturing an electronic device according to claim 2, further comprising:

separating the solvent ions and functional material ions originated from the functional material from the pseudo-molecular ions, and reciprocally deflecting the functional material ions.

4. The method of manufacturing an electronic device according to claim 2, the substrate having a plurality of electronic devices formed thereon, and the selective potential setting of the plurality of electrodes formed for each of the plurality of electronic devices are performed by signal lines and power supply lines that are commonly formed for the plurality of electronic devices.

5. The method of manufacturing an electronic device according to claim 4, the signal lines and the power supply lines that are commonly formed for the plurality of electronic devices formed on the substrate being wired in such a way as not to cross each other in middle regions between the electronic devices formed on the substrate.

6. The method of manufacturing an electronic device according to claim 2, setting circuits to selectively set predetermined potentials for the plurality of electrodes are formed in the formation regions of the electronic devices formed on the substrate, and the setting circuits using at least one portion of original electronic circuits of the electronic devices formed in formation regions.

7. The method of manufacturing an electronic device according to claim 6, the electronic devices formed in the formation regions on the substrate being electro-optical devices, the plurality of electrodes being element electrodes of a plurality of electro-optical elements formed in the electro-optical devices, and the electronic circuits used in the setting circuits including element driving circuits of the electro-optical elements.

* * * * *